(12) United States Patent
Sun et al.

(10) Patent No.: US 9,647,212 B2
(45) Date of Patent: May 9, 2017

(54) MASK PLATE, METHOD FOR PACKAGING OLED DEVICE AND OLED DEVICE

(71) Applicant: BOE Technology Group Co., Ltd., Beijing (CN)

(72) Inventors: Tao Sun, Beijing (CN); Tao Wang, Beijing (CN); Song Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/906,101

(22) PCT Filed: Jun. 23, 2015

(86) PCT No.: PCT/CN2015/082017
§ 371 (c)(1),
(2) Date: Jan. 19, 2016

(87) PCT Pub. No.: WO2016/119381
PCT Pub. Date: Aug. 4, 2016

(65) Prior Publication Data
US 2016/0380202 A1  Dec. 29, 2016

(30) Foreign Application Priority Data

Jan. 29, 2015 (CN) .......................... 2015 1 0046592

(51) Int. Cl.
*H01L 51/00* (2006.01)
*H01L 51/52* (2006.01)
(Continued)

(52) U.S. Cl.
CPC .......... *H01L 51/0017* (2013.01); *C23C 14/04* (2013.01); *H01L 27/32* (2013.01);
(Continued)

(58) Field of Classification Search
CPC . H01L 51/0017; H01L 27/32; H01L 51/0029; H01L 51/52; H01L 51/5253; H01L 51/56; C23C 14/04
See application file for complete search history.

(56) References Cited

U.S. PATENT DOCUMENTS 5,156,563 A * 10/1992 Park .................... H01J 29/94
445/11
2014/0110685 A1 * 4/2014 Hong ................... C23C 14/042
257/40

(Continued)

FOREIGN PATENT DOCUMENTS

CN     101697343 A    4/2010
CN     102768994 A    11/2012
(Continued)

OTHER PUBLICATIONS

Oct. 29, 2015—(WO)—International Search Report and Written Opinion Appn PCT/CN2015/082017 with English Tran.
(Continued)

*Primary Examiner* — Karen Kusumakar
(74) *Attorney, Agent, or Firm* — Banner & Witcoff, Ltd.

(57) ABSTRACT

A mask plate, a method for packaging an OLED device and an OLED device are disclosed, the mask plate includes at least one opening for forming a pattern of a package layer; the side of the mask plate close to the OLED device to be packaged has an etching layer which is used to etch the material of a package layer.

18 Claims, 3 Drawing Sheets

(51) Int. Cl.
  *H01L 51/56* (2006.01)
  *C23C 14/04* (2006.01)
  *H01L 27/32* (2006.01)
(52) U.S. Cl.
  CPC .......... *H01L 51/0029* (2013.01); *H01L 51/52* (2013.01); *H01L 51/5253* (2013.01); *H01L 51/56* (2013.01)

(56) References Cited

U.S. PATENT DOCUMENTS

2014/0132148 A1* 5/2014 Jang .................... H01L 51/5256
    313/504
2014/0349422 A1 11/2014 Chen et al.

FOREIGN PATENT DOCUMENTS

| CN | 103370806 A | 10/2013 |
| CN | 103477452 A | 12/2013 |
| CN | 203503649 U | 3/2014 |
| CN | 104022233 A | 9/2014 |
| CN | 104051495 A | 9/2014 |
| CN | 203883009 U | 10/2014 |
| CN | 104201189 A | 12/2014 |
| CN | 104674162 A | 6/2015 |

OTHER PUBLICATIONS

Nov. 2, 2016—(CN) First Office Action Appn 201510046592.5 with English Tran.

* cited by examiner

MASK PLATE, METHOD FOR PACKAGING OLED DEVICE AND OLED DEVICE

The application is a U.S. National Phase Entry of International Application No. PCT/CN2015/082017 filed on Jun. 23, 2015, designating the United States of America and claiming priority to Chinese Patent Application No. 201510046592.5 filed on Jan. 29, 2015. The present application claims priority to and the benefit of the above-identified applications and the above-identified applications are incorporated by reference herein in their entirety.

TECHNICAL FIELD

Embodiments of the present invention relate to a mask plate, a method for packaging an OLED device and an OLED device.

BACKGROUND

An OLED (organic light-emitting diode) device can emit light by itself through an organic layer, because the OLED device does not need a back light, the OLED device has a faster response time and a greater viewing angle. Besides, the OLED device also has the advantages of higher contrast, lighter weight, low power consumption, and capable of being prepared by a flexible substrate, and the OLED device is considered as the panel display device with the greatest development potential.

However, the life issue of the OLED device restricts the pace of its industrialization. Each component of the OLED device is easy to be eroded by water and oxygen, which leads to the damage of pixels, thus shorten the life of the device, therefore, the OLED device needs an effective packaging process to prevent the invasion of the water vapor and oxygen and prevent the aging of the organic material, so as to extend the life span of the OLED device.

The OLED device prepared on the flexible substrate also needs to be packaged. The methods for packaging the flexible OLED device mainly comprise two kinds: covering plate packaging and film packaging. Because the film packaging is easy to be implemented in the flexible packaging of the OLED device, therefore the film packaging has been widely used. The film packaging method usually uses a mask plate to form the film in vacuum, that is, the area that does not need to be packaged, the area for the leading wires in the following up process and the circuit leading wires is exposed on the surface, to facilitate the operation of the following up process. But when forming the film in vacuum, the masking shadow phenomenon as shown in FIG. 1 often occurs, that is when forming the film, the film of the package layer 2 will grow to the area under and covered by the mask plate 1, this is likely to cover the circuit leading wire portion, which will seriously affect the following up process and accordingly the quality of the product. Besides, the mask shadow can cause the increase of the size of the film 2, thus affect the precision of the alignment, causing an incomplete packaging of the effectively light-emitting area of the OLED device or packaging in an excessive width region, so as to affect the circuit wiring part and cannot achieve a design of a narrow margin.

SUMMARY

Embodiments of the present disclosure provide a mask plate, wherein the mask plate comprises at least one opening for forming a pattern of a package layer; an etching layer which is used to etch the material of a package layer is provided on a side of the mask plate that is close to the OLED device to be packaged.

Embodiments of the present disclosure further provide a method for packaging an OLED device, the method for packaging the OLED device uses the above-mentioned mask plate, the method comprises:

forming a package layer, by a mask plate, on a surface of an OLED substrate to be packaged, an etching layer which is used to etch the material of a package layer is provided on a side of the mask plate that is close to the OLED substrate to be packaged;

removing the mask plate after a reaction of the etching layer of the mask plate with the package layer that is in a region under and covered by the mask plate ends.

Embodiments of the present disclosure further provide an OLED device formed by the above-mentioned method, wherein the OLED device comprises an OLED substrate and a package layer, during the process of packaging, the pattern of the package layer has a same size as the opening of the mask plate.

With the mask plate, the method for packaging an OLED device and the OLED device provided by the embodiments of the present disclosure, the side of the mask plate that is close to the OLED device to be packaged is provided with an etching layer which is used to etch the material of a package layer, thus during the process of film packaging, the etching layer can react with the material of the package layer in the masking shadow area, thus the material of the package layer in the area can be removed. The mask plate of this structure effectively eliminates the masking shadow and improves the packaging quality of the OLED products and achieves the design of the narrow margin in the OLED device.

BRIEF DESCRIPTION OF THE DRAWINGS

In order to clearly illustrate the technical solution of the embodiments of the disclosure, the drawings of the embodiments will be briefly described in the following, it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 3:
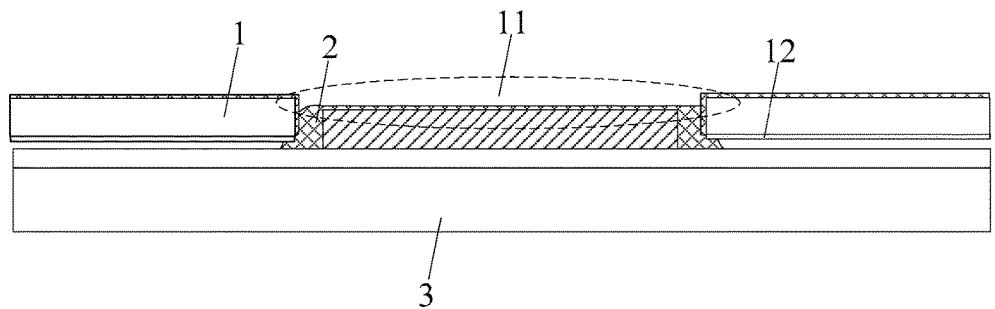
FIG. 3 is a structure schematic diagram of an OLED device according to an embodiment of the present disclosure.

A mask plate provided by an embodiment of the present disclosure is shown in FIG. 3. The mask plate 1 comprises at least one opening 11 for forming a pattern of a package layer 2.

A side of the mask plate 1 that is close to the OLED substrate to be packaged 3 is provided with an etching layer 12 which is used to etch a material of the package layer.

In the mask plate provided by the embodiments of the present disclosure, an etching layer which is used to etch the material of a package layer is formed on a side of the mask plate that is close to the OLED substrate to be packaged, thus during the process of the film packaging, the etching layer can react with the material of the package layer that is in a shadow region under the mask plate, thus the material of the package layer in the region can be removed. The mask plate of this structure effectively eliminates the masking shadow and improves the packaging quality of the OLED products and achieves the design of the narrow margin in the OLED device.

It's required to be noted that, in an embodiment of the present disclosure, the number of the openings 11 in the mask plate 1 is the same as the number of the OLED device panel on the OLED substrate 3.

Optionally, the etching layer 12 can be formed by coating acidic liquid.

In order to achieve an effective isolation of water and oxygen, the package layer 12 usually uses silicon compounds, for example silicon nitride or silica materials. Therefore, in order to react the etching layer 12 with the package layer 2, in an embodiment of the present disclosure, the etching layer 12 can be obtained by a liquid coating process with a hydrofluoric acid solution or a nitrogen trifluoride solution. In a practical process, based on the material of the package layer 2, an acid solution used to react with it can be specifically selected. The above recitation is just an example, and the acid solution is not limited thereto by the embodiment of the present disclosure.

Optionally, the etching layer 12 can be disposed on the mask plate in a range of a preset distance away from an edge of the opening, and the preset distance guarantees that an area of the etching layer 12 can cover the package layer that is in a masking shadow area under the mask plate.

Figure 6:
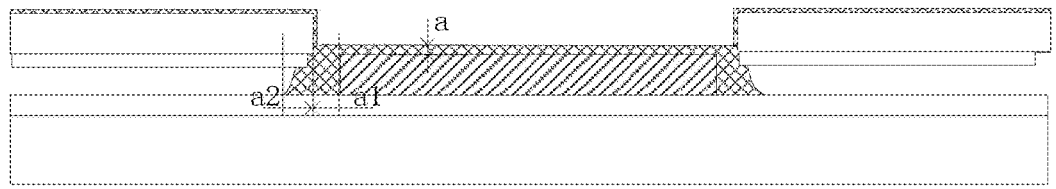
FIG. 6 is a schematic diagram of depositing a package layer by using a first mask plate according to another embodiment of the present disclosure.

For example, the etching layer 12 is coated near the opening 11 of the mask plate according to an investigating of the actual range of the masking shadow area, to ensure that the area of the etching layer 12 can cover the package layer 2 in the masking shadow area, that is the area that is covered by the etching layer 12 on the mask plate is greater than the size a2 of the shadow area (as shown in FIG. 6). By the relatively accurate alignment of the etching layer 12 and the package layer 2 in the masking shadow area, the influence of the etching layer 12 on other area can be reduced and the quality of encapsulation can be effectively guaranteed.

Figure 4:
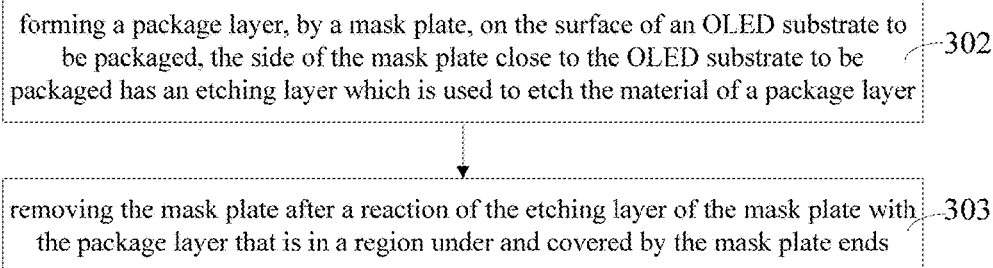
FIG. 4 is a processing schematic diagram of a method for packaging an OLED device according to an embodiment of the present disclosure.

An embodiment of the present disclosure provides a method for packaging an OLED device, the method for packaging the OLED device uses the above-mentioned mask plate, as shown in FIG. 4, the method comprises:

step 302, forming a package layer, by a mask plate, on the surface of an OLED substrate to be packaged, the side of the mask plate close to the OLED substrate to be packaged has an etching layer which is used to etch the material of a package layer;

step 303, removing the mask plate after a reaction of the etching layer of the mask plate with the package layer that is in a region under and covered by the mask plate ends.

With the method for packaging an OLED device provided by an embodiment of the present disclosure, the package layer is formed by using the mask plate, an etching layer which is used to etch the material of a package layer is formed on the side of the mask plate that is close to the OLED device to be packaged, thus during the process of packaging the film, the etching layer can react with the material of the package layer in the masking shadow area, thus the material of the package layer in the area is removed. The mask plate of this structure effectively eliminates the masking shadow phenomenon and improves the packaging quality of the OLED products and achieves the design of the narrow margin of the OLED device.

Figure 5:
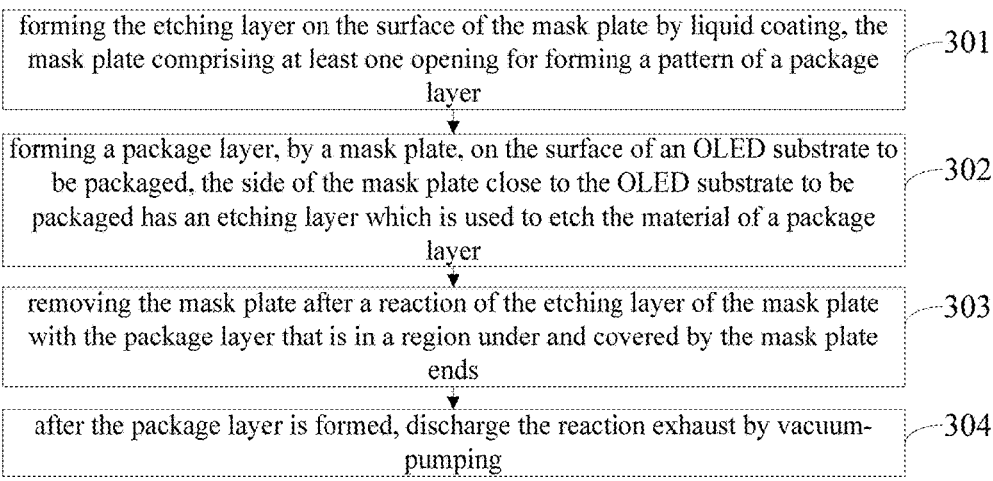
FIG. 5 is another processing schematic diagram of a method for packaging an OLED device according to an embodiment of the present disclosure.

Further, as shown in FIG. 5, before forming the package layer, the method can also comprises:

step 301, forming the etching layer on the surface of the mask plate by liquid coating, the mask plate comprising at least one opening for forming a pattern of a package layer.

It's required to be noted that, in an embodiment of the present disclosure, the number of the openings 11 in the mask plate 1 is the same as the number of the OLED device panel on the OLED substrate 3.

In these cases, it is similar to the above-mentioned embodiments, the etching layer can be formed by coating acidic liquid.

The etching layer can be disposed on the mask plate in a range of a preset distance away from an edge of the opening, and the preset distance should guarantee that the area of the etching layer can cover the package layer of the masking shadow area.

Further, as shown in FIG. 5, the method can also comprises:

Step 304, after the package layer is formed, discharge the reaction exhaust by vacuum-pumping.

An example of forming the OLED device of multiple package layers by the mask plate is shown below step by step, to illustrate the method for packaging the OLED device provided by the embodiment of the present disclosure in detail.

A surface coating process is performed on the first mask plate to form an etching layer, the coated surface is the surface facing the OLED panel to be packaged, the coated material is acids, for example HF, which can etch a material such as silicon nitride or silica away.

The first the inorganic package layer is formed as shown in FIG. 6, the package layer is disposed by using a first mask plate, with a thickness of the layer being a, a opening width between an edge of the opening in the first mask plate and the OLED device in a horizontal direction being a1, and a width of the masking shadow region being a2.

Figure 7:
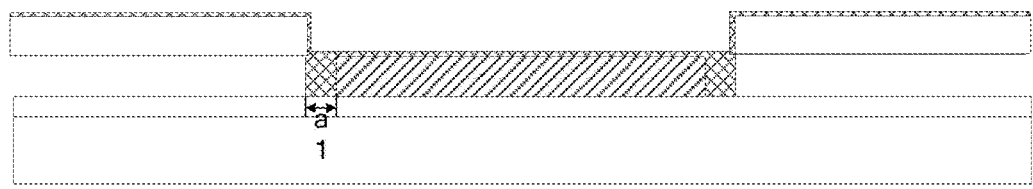
FIG. 7 is a structure schematic diagram of an OLED substrate after forming a first package layer according to another embodiment of the present disclosure.

The package layer under the first mask plate reacts with the material of the etching layer and generates gas which is discharged into a collection tube for waste gas before forming the film for the next time. The a2 region is etched by the material of the etching layer, after completing the first layer, as shown in FIG. 7, the packaging frame width is the opening width a1 between the first mask plate and the OLED devices. As compared with the packaging frame width after completing the first layer in the prior art being a2+a1, the method for packaging the OLED device provided by the embodiment of the present disclosure can effectively eliminate the influence of masking shadow phenomenon. It should be noted that, FIG. 7 only schematic shows the OLED substrate structure after forming the first package layer, in the actual situation, the etching layer 12 and the shadow region a2 may not disappear as completely as shown in FIG. 7.

Repeating the above steps except using a second mask plate at this stage, the size of the opening of the second mask plate is greater than the size of the opening of the first mask plate, an etching layer is also formed by coating on the second mask plate near the opening.

Figure 1:
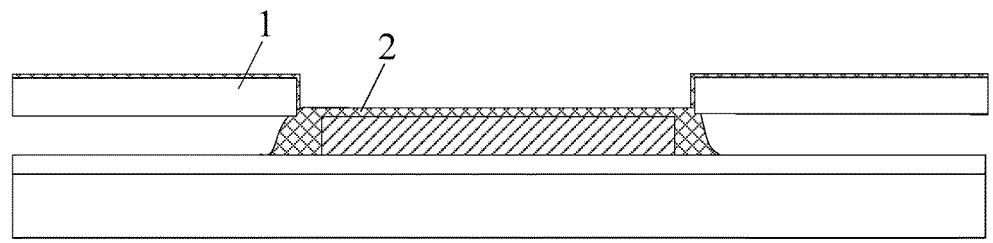
FIG. 1 is a schematic diagram of a masking shadow produced in the OLED device of the prior art.
Figure 2:
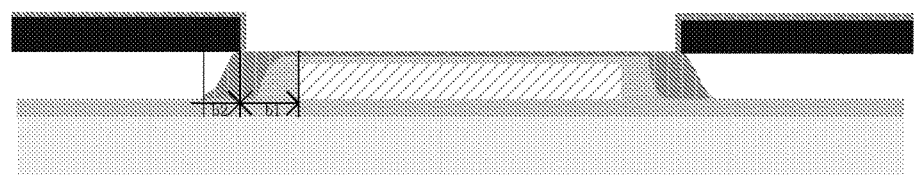
FIG. 2 is a schematic diagram of depositing the package layer by using a second mask plate in the prior art.
Figure 8:
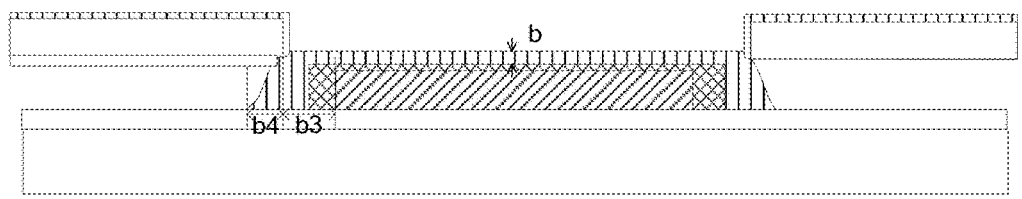
FIG. 8 is a schematic diagram of depositing the package layer by using a second mask plate according to another embodiment of the present disclosure.

Similar to the previous steps, a second inorganic package layer is formed by depositing the package layer with the second mask plate as shown in FIG. 8, with the thickness of the layer being b. In the prior art, an opening width between an edge of the opening in the second mask plate and the OLED devices in a horizontal direction being b1, and a width of the masking shadow region being b2 (refer to FIG. 2), and b1 is always greater than a2+a1, however the packaging frame width of the second package layer after forming the film according to prior art is b1+b2. With the etching process of the present disclosure, because a1<b3<b1, the opening width of the second mask plate can be reduced by an amount of 2(b1-b3), the width of the masking shadow region of the second layer is b4.

Figure 9:
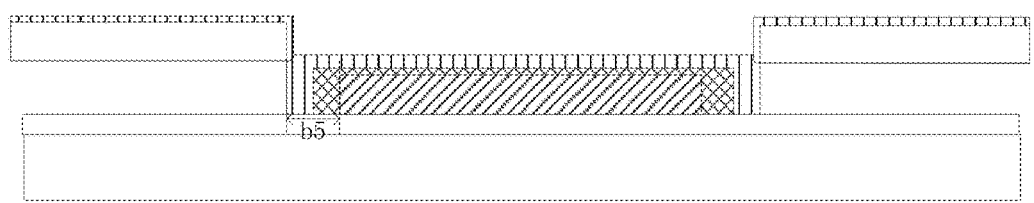
FIG. 9 is a structure schematic diagram of the OLED substrate after forming a second package layer according to another embodiment of the present disclosure.

The package layer under the second mask plate reacts with the material of the etching layer, and the masking shadow region b4 under the second mask plate is etched, after finishing the second layer, the width of the packaging frame is b5, and b3<b5<b1+b2 (b1+b2 is the packaging frame width according to the prior art), as shown in FIG. 9.

The subsequent inorganic package layers can also be prepared by the above method, the method for packaging OLED can effectively reduce the frame width of the devices to achieve a narrow frame packaging technology.

An embodiment of the present disclosure further provides an OLED device, which is obtained by the above method for packaging OLED device. As shown in FIG. 3, the OLED device comprises an OLED substrate 3 and a package layer 2, during the process of packaging, the pattern of the package layer 2 has a size that is the same as the size of the opening of the mask plate 1.

The method for packaging the OLED device has been described in detail in the above-mentioned embodiments, which will not be described here for simplicity.

The package layer in the OLED device provided by the embodiment of the present disclosure is formed by a mask plate, wherein an etching layer which is used to etch the material of the package layer is formed on a side of the mask plate that is close to the OLED substrate to be packaged, thus during the process of film packaging, the etching layer can react with the material of the package layer in the masking shadow region, thus the material of the package layer in the area can be removed. The mask plate of this structure effectively eliminates the masking shadow and improves the packaging quality of the OLED products and achieves the design of the narrow margin of the OLED device.

The OLED devices provided by the embodiments of the present disclosure can be used in various known OLED display instruments, such as, a mobile phone, a tablet computer, a television, a monitor, a notebook computer, a digital picture frame, a navigation system and other product or component which use an OLED display device as a display.

The above is only the model implementation ways of the present disclosure, and not used to limit the scope of protection of the present disclosure, the scope of protection of the present disclosure is determined by the attached claims.

The present application claims the priority of the Chinese Patent Application No. 201510046592.5 filed on Jan. 29, 2015, which is incorporated herein by reference as part of the disclosure of the present application.

The invention claimed is:

1. A mask plate, wherein the mask plate comprises at least one opening for forming a pattern of a package layer;
   an etching layer which is used to etch a material of the package layer is coated on a side of the mask plate.

2. The mask plate according to claim 1, wherein the etching layer is a hydrofluoric acid solution or a nitrogen trifluoride solution.

3. The mask plate according to claim 1 wherein the etching layer is disposed on the mask plate in a range of a preset distance away from an edge of the opening, and the preset distance guarantees that an area of the etching layer can cover the package layer that is in a shadow region under the mask plate.

4. A method for packaging an organic light-emitting diode (OLED) device, comprising:
   forming a package layer, by a mask plate, on a surface of an OLED substrate to be packaged, a side of the mask plate that is close to the OLED substrate to be packaged is provided with an etching layer which is used to etch a material of the package layer; and
   removing the mask plate after a reaction of the etching layer of the mask plate with the package layer that is in a region under and covered by the mask plate ends.

5. The method for packaging the OLED device according to claim 4, wherein before forming the package layer, the method further comprises:
   forming the etching layer on a surface of the mask plate by liquid coating, the mask plate comprising at least one opening which is used to form a pattern of the package layer.

6. The method for packaging the OLED device according to claim 5, wherein the etching layer is formed by coating a hydrofluoric acid solution or a nitrogen trifluoride solution.

7. The method for packaging the OLED device according to claim 5, wherein the etching layer is disposed on the mask plate in a range of a preset distance away from an edge of the opening, and the preset distance guarantees that an area of the etching layer can cover the package layer in a shadow region under the mask plate.

8. The method for packaging the OLED device according to claim 4, wherein the method further comprises:
   after forming the pattern of the package layer, removing waste gas which is formed during the reaction of the etching layer with the package layer by evacuation.

9. An organic light-emitting diode (OLED) device formed by the method according to claim 5, wherein the OLED device comprises the OLED substrate and the package layer, during a process of packaging, the pattern of the package layer has a same size as the opening of the mask plate.

10. The mask plate according to claim 2, wherein the etching layer is disposed on the mask plate in a range of a preset distance away from an edge of the opening, and the preset distance guarantees that an area of the etching layer can cover the package layer that is in a shadow region under the mask plate.

11. The method for packaging the OLED device according to claim 5, wherein the method further comprises:
   after forming the pattern of the package layer, removing waste gas which is formed during the reaction of the etching layer with the package layer by evacuation.

12. The method for packaging the OLED device according to claim 6, wherein the method further comprises:
   after forming the pattern of the package layer, removing waste gas which is formed during the reaction of the etching layer with the package layer by evacuation.

13. The method for packaging the OLED device according to claim 7, wherein the method further comprises:
   after forming the pattern of the package layer, removing waste gas which is formed during the reaction of the etching layer with the package layer by evacuation.

14. The OLED device according to claim 9, wherein the etching layer is formed by coating a hydrofluoric acid solution or a nitrogen trifluoride solution.

15. The OLED device according to claim 9, wherein the etching layer is disposed on the mask plate in a range of a preset distance away from an edge of the opening, and the preset distance guarantees that an area of the etching layer can cover the package layer in a shadow region under the mask plate.

16. The OLED device according to claim 9, wherein the method further comprises:
   after forming the pattern of the package layer, removing waste gas which is formed during the reaction of the etching layer with the package layer by evacuation.

17. The OLED device according to claim 14, wherein the method further comprises:
   after forming the pattern of the package layer, removing waste gas which is formed during the reaction of the etching layer with the package layer by evacuation.

18. The OLED device according to claim 15, wherein the method further comprises:
   after forming the pattern of the package layer, removing waste gas which is formed during the reaction of the etching layer with the package layer by evacuation.

* * * * *